(12) United States Patent
Miyakawa

(10) Patent No.: US 9,275,921 B2
(45) Date of Patent: Mar. 1, 2016

(54) SEMICONDUCTOR DEVICE

(71) Applicant: Kabushiki Kaisha Toshiba, Minato-ku, Tokyo (JP)

(72) Inventor: Takeshi Miyakawa, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/454,159

(22) Filed: Aug. 7, 2014

(65) Prior Publication Data

US 2015/0214139 A1 Jul. 30, 2015

(30) Foreign Application Priority Data

Jan. 30, 2014 (JP) ................. 2014-015207

(51) Int. Cl.
*H01L 23/495* (2006.01)
*H01L 23/28* (2006.01)
*H01L 23/00* (2006.01)
*H01L 23/433* (2006.01)
*H01L 23/492* (2006.01)

(52) U.S. Cl.
CPC ............ *H01L 23/28* (2013.01); *H01L 23/4334* (2013.01); *H01L 23/492* (2013.01); *H01L 23/49568* (2013.01); *H01L 24/34* (2013.01); *H01L 23/49541* (2013.01); *H01L 23/49548* (2013.01); *H01L 23/49562* (2013.01); *H01L 2224/0603* (2013.01); *H01L 2224/32245* (2013.01); *H01L 2924/13055* (2013.01); *H01L 2924/181* (2013.01)

(58) Field of Classification Search
CPC ............................................. H01L 23/49568
USPC ........................... 257/666, 675, 669, E23.051
See application file for complete search history.

(56) References Cited

U.S. PATENT DOCUMENTS

| 4,935,803 | A | * | 6/1990 | Kalfus | .............. H01L 23/49562 257/673 |
| 6,040,626 | A | * | 3/2000 | Cheah | ............... H01L 23/49562 257/341 |
| 6,256,200 | B1 | * | 7/2001 | Lam et al. | ...................... 361/704 |
| 6,630,726 | B1 | | 10/2003 | Crowley et al. | |
| 6,707,138 | B2 | * | 3/2004 | Crowley et al. | ............... 257/676 |
| 6,777,800 | B2 | * | 8/2004 | Madrid | ............. H01L 23/49524 257/666 |
| 6,867,481 | B2 | * | 3/2005 | Joshi | ...................... H01L 21/565 257/666 |
| 6,992,385 | B2 | | 1/2006 | Satou et al. | |
| 7,256,479 | B2 | * | 8/2007 | Noquil | .................... H01L 23/36 257/666 |
| 7,683,414 | B2 | | 3/2010 | Nagano et al. | |
| 7,768,105 | B2 | | 8/2010 | Cruz et al. | |
| 8,193,618 | B2 | * | 6/2012 | Madrid | ......................... 257/670 |

(Continued)

FOREIGN PATENT DOCUMENTS

JP 2008-124390 A 5/2008
WO 2011077781 A1 6/2011

*Primary Examiner* — Nitin Parekh
(74) *Attorney, Agent, or Firm* — White & Case LLP

(57) ABSTRACT

According to one embodiment, the connector has a first portion and a second portion. The first portion is provided on the second surface of the semiconductor chip and bonded to the second electrode. The first portion has a first bonding surface bonded to the second electrode of the semiconductor chip, and a heat dissipation surface opposite the first bonding surface and exposed from the resin. The second portion protrudes from the first portion toward the second lead frame side and thinner than the first portion. The second portion has a second bonding surface bonded to the second lead frame and a level difference portion provided near the second bonding surface at the first portion side.

20 Claims, 8 Drawing Sheets

(56) References Cited

U.S. PATENT DOCUMENTS

| | | | |
|---|---|---|---|
| 8,513,618 B2* | 8/2013 | Maniscalco et al. | 250/395 |
| 2009/0057855 A1* | 3/2009 | Quinones | H01L 23/49551 257/676 |
| 2009/0230519 A1* | 9/2009 | Otremba et al. | 257/666 |
| 2010/0109135 A1* | 5/2010 | Jereza | 257/676 |
| 2010/0155913 A1* | 6/2010 | Madrid | 257/666 |
| 2010/0164078 A1* | 7/2010 | Madrid et al. | 257/675 |

* cited by examiner

A - A

SEMICONDUCTOR DEVICE

CROSS-REFERENCE TO RELATED APPLICATION

This application is based upon and claims the benefit of priority from Japanese Patent Application No. 2014-015207, filed on Jan. 30, 2014; the entire contents of which are incorporated herein by reference.

FIELD

Embodiments described herein relate generally to a semiconductor device.

BACKGROUND

These days, for power devices, a structure in which a plate-like connector or strap of copper or the like, not wire bonding, is used as a connection structure between a chip and an external lead is proposed in order to reduce resistance, and there are a growing number of such products.

Furthermore, a structure is proposed in which a connector mounted on a chip is exposed from a resin, and heat is dissipated from both the lower surface of a package on the mounting substrate side and the upper surface of the package. In this structure, the peculiar problem caused by exposing the upper surface of the package is a concern, and solution to the problem is required.

DETAILED DESCRIPTION

Figure 1:
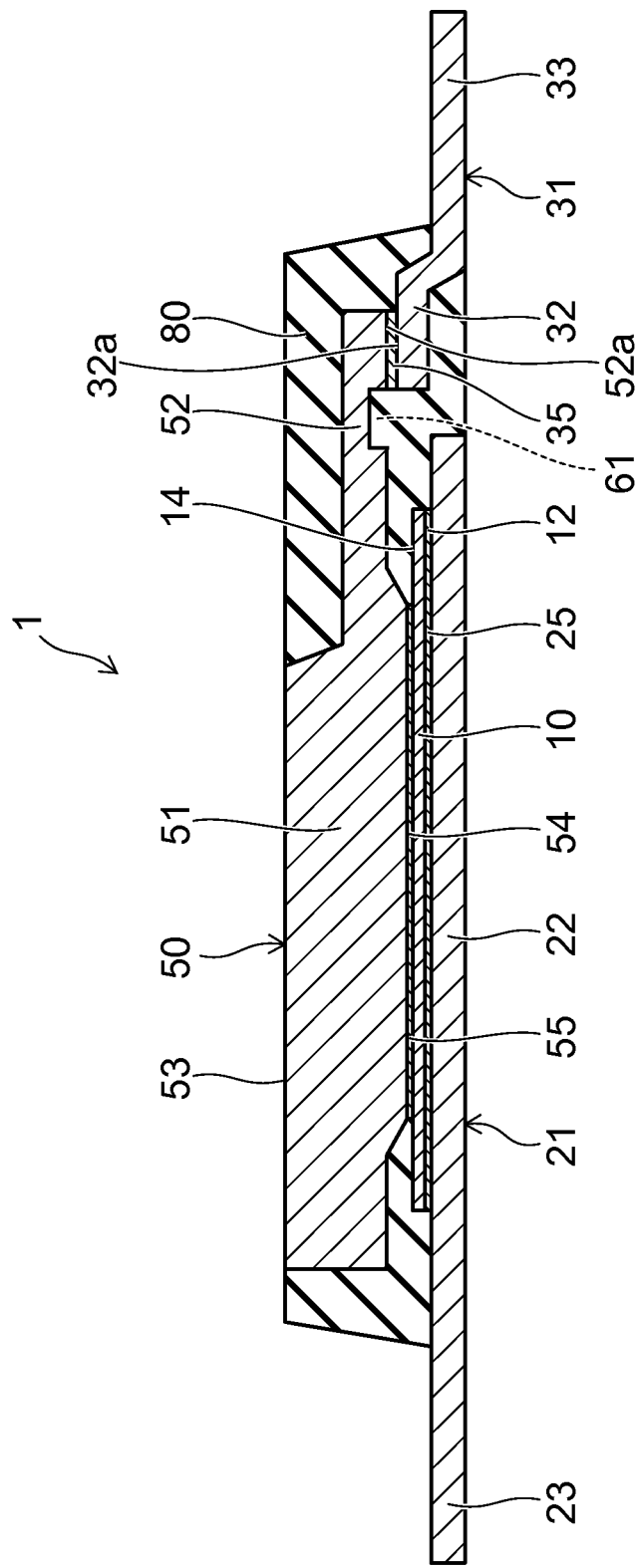
FIG. 1 is a schematic cross-sectional view of a semiconductor device of an embodiment.

According to one embodiment, a semiconductor device includes a first lead frame, a second lead frame provided to be separated from the first lead frame, a semiconductor chip provided on the first lead frame, a resin sealing the semiconductor chip, and a connector. The semiconductor chip includes a semiconductor layer, a first electrode, and a second electrode. The semiconductor layer has a first surface and a second surface opposite the first surface. The first electrode is provided on the first surface and bonded to the first lead frame. The second electrode is provided on the second surface. The connector has a first portion and a second portion. The first portion is provided on the second surface of the semiconductor chip and bonded to the second electrode. The first portion has a first bonding surface bonded to the second electrode of the semiconductor chip, and a heat dissipation surface opposite the first bonding surface and exposed from the resin. The second portion protrudes from the first portion toward the second lead frame side and thinner than the first portion. The second portion has a second bonding surface bonded to the second lead frame and a level difference portion provided near the second bonding surface at the first portion side.

Hereinbelow, embodiments are described with reference to the drawings. In the drawings, identical components are marked with the same reference numerals.

FIG. 1 is a schematic cross-sectional view of a semiconductor device 1 of an embodiment.

Figure 2A:
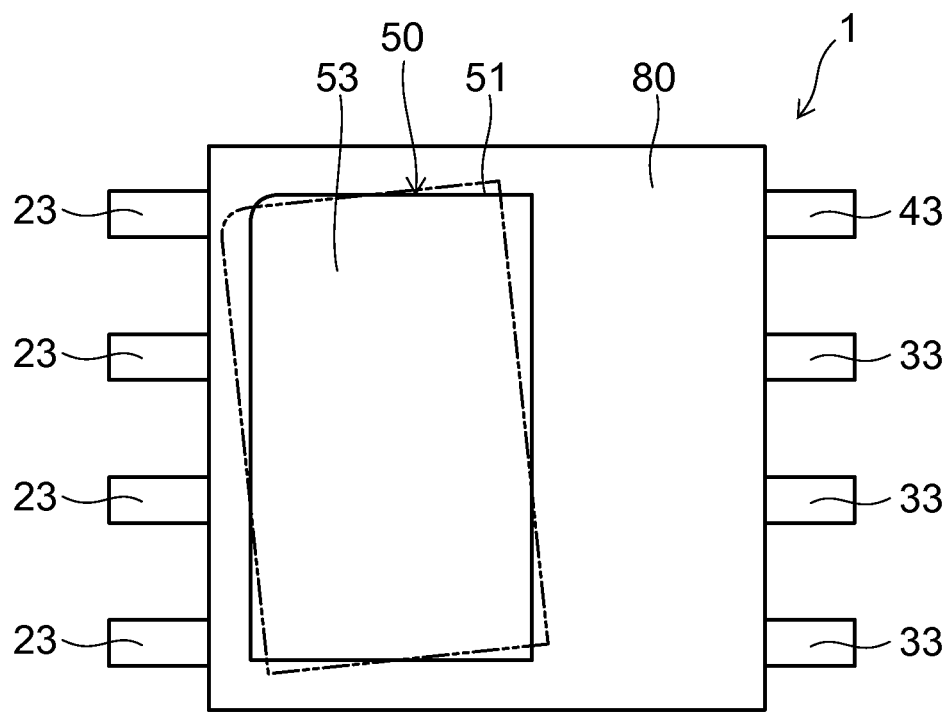
FIGS. 2A and 2B are schematic top views of the semiconductor device of the embodiment.
Figure 2B:
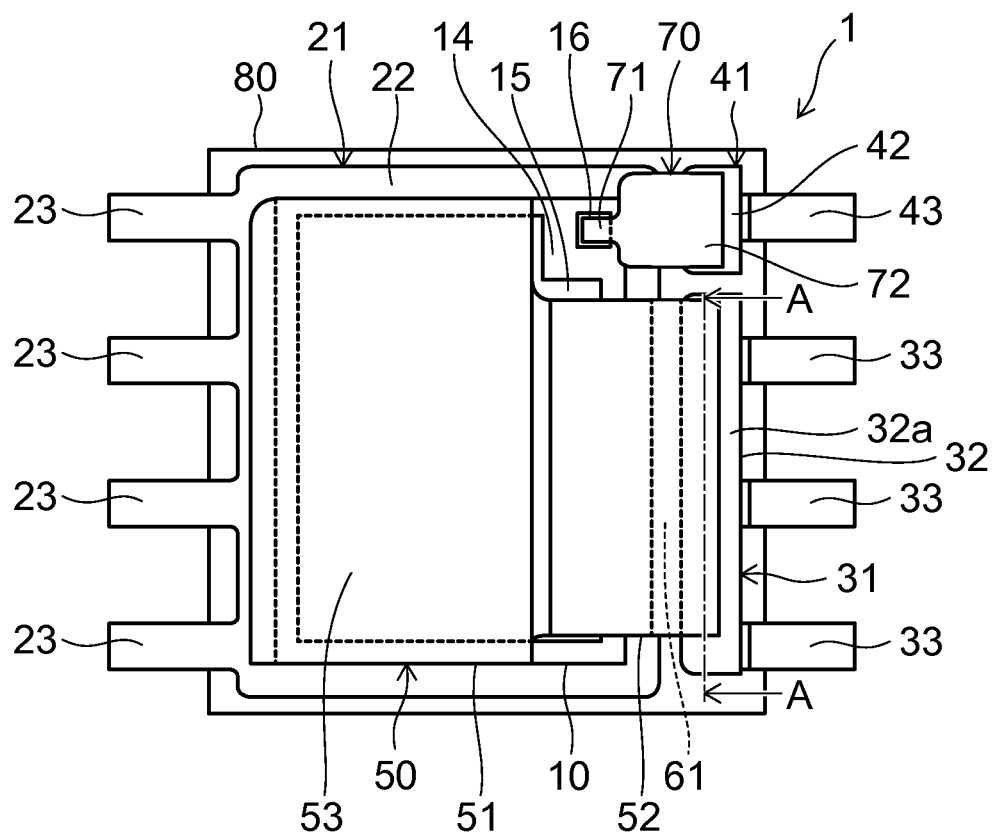

FIG. 2A is a schematic top view of the semiconductor device 1 of the embodiment, and FIG. 2B is a schematic top view in which a resin 80 is removed. In FIG. 2B, only the external outline of the side surface is shown for the resin 80.

The semiconductor device 1 of the embodiment includes a semiconductor chip 10, lead frames 21, 31, and 41 electrically connected to the semiconductor chip 10, a connector 50 connecting the semiconductor chip 10 and the lead frame 31, and the resin 80 sealing these components.

The semiconductor chip 10 is a vertical device in which a current path is formed in the vertical direction connecting a first electrode provided on one surface side of a semiconductor layer and a second electrode provided on the other surface side. The semiconductor chip 10 is a vertical MOSFET (metal-oxide-semiconductor field effect transistor), for example. Alternatively, the semiconductor chip 10 is a vertical IGBT (insulated gate bipolar transistor) or a vertical diode.

Silicon is used as the semiconductor. Alternatively, a semiconductor other than silicon (for example, a compound semiconductor such as SiC and GaN) may be used.

Figure 3A:
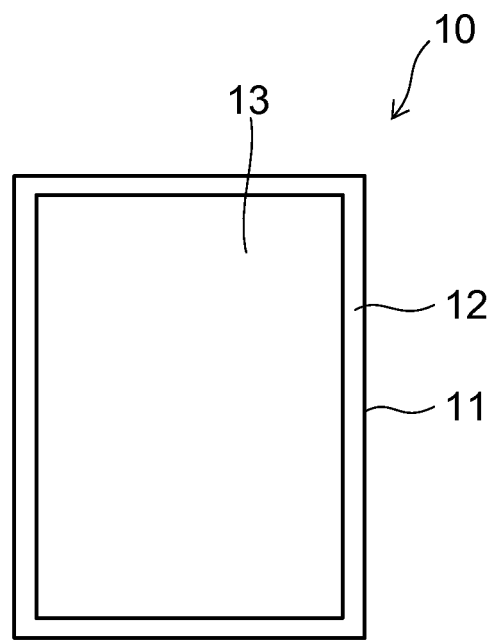
FIGS. 3A and 3B are schematic plan views of a semiconductor chip of the embodiment.
Figure 3B:
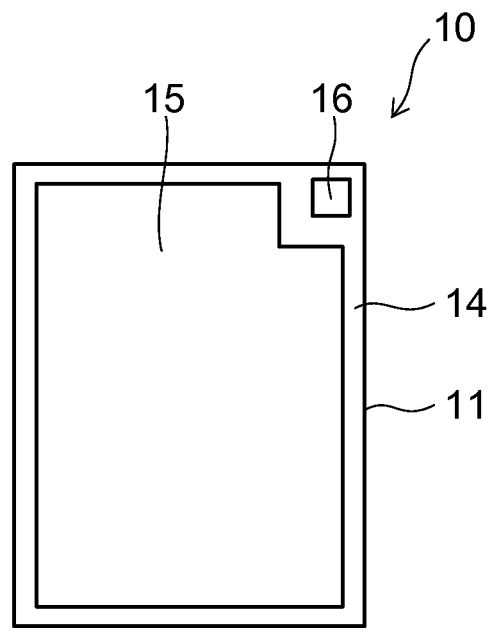

FIG. 3A is a schematic plan view of a first surface 12 of the semiconductor chip 10, and FIG. 3B is a schematic plan view of a second surface 14 on the opposite side to the first surface 12.

As shown in FIG. 3A, a first electrode 13 is formed on the first surface 12 of a semiconductor layer 11. In a MOSFET, the first electrode 13 is a drain electrode, for example. The first electrode 13 is formed to occupy the most part of the first surface 12.

As shown in FIG. 3B, on the second surface 14 of the semiconductor layer 11, a second electrode 15 and a third electrode 16 are formed to be dielectrically isolated from each other. The second electrode 15 is formed to occupy the most part of the second surface 14, and is a source electrode in a MOSFET, for example. The third electrode 16 has a smaller area than the second electrode 15, and is a gate electrode in a MOSFET, for example.

As shown in FIG. 2B, the first lead frame 21 includes a die pad 22 and a plurality of leads 23. The die pad 22 is formed to have a planar shape of a quadrangle, and the plurality of leads 23 protrude from one side of the quadrangle. The first lead frame 21 is molded by molding processing of a metal plate, and the die pad 22 and the lead 23 are provided integrally.

On the opposite side to the protruding direction of the lead 23 of the first lead frame 21, the second lead frame 31 is provided apart from the first lead frame 21.

The second lead frame 31 includes an inner lead 32 provided on the first lead frame 21 side and a plurality of outer leads 33 protruding from the inner lead 32. The outer lead 33 protrudes in the opposite direction to the protruding direction of the lead 23 of the first lead frame 21. The inner lead 32 extends in a direction orthogonal to the protruding direction of the outer lead 33 and the protruding direction of the lead 23 of the first lead frame 21.

The second lead frame 31 is molded by molding processing of a metal plate, and the inner lead 32 and the outer lead 33 are provided integrally.

On the opposite side to the protruding direction of the lead 23 of the first lead frame 21, also the third lead frame 41 is provided apart from the first lead frame 21. The third lead frame 41 is provided adjacent to the inner lead 32 of the second lead frame 31 in the longitudinal direction. The third lead frame 41 is apart from the second lead frame 31.

The third lead frame 41 includes an inner lead 42 provided on the first lead frame 21 side and one outer lead 43 protruding from the inner lead 42. The outer lead 43 protrudes in the same direction as the protruding direction of the outer lead 33 of the second lead frame 31.

As shown in FIG. 1, no level difference is formed between the lead 23 and the die pad 22 of the first lead frame 21; the upper surface of the lead 23 and the upper surface of the die pad 22 are joined together in a flat manner, and the lower surface of the lead 23 and the lower surface of the die pad 22 are joined together in a flat manner.

The second lead frame 31 is bent in a portion between the inner lead 32 and the outer lead 33, and a level difference is formed between the inner lead 32 and the outer lead 33. Also the third lead frame 41 is, similarly to the second lead frame 31, bent in a portion between the inner lead 42 and the outer lead 43, and a level difference is formed between the inner lead 42 and the outer lead 43.

The lower surface of the outer lead 33 of the second lead frame 31 is at the same height level as the lower surface of the first lead frame 21 (the lower surface of the lead 23 and the lower surface of the die pad 22). The lower surface of the outer lead 43 of the third lead frame 41 is at the same height level as the lower surface of the first lead frame 21 and the lower surface of the outer lead 33 of the second lead frame 31.

Taking the lower surfaces of the outer leads 33 and 43 and the lower surface of the first lead frame 21 as a reference of the height direction (vertical direction), the upper surfaces of the inner leads 32 and 42 are located above the upper surface of the die pad 22.

The semiconductor chip 10 is mounted on the die pad 22 of the first lead frame 21. The semiconductor chip 10 directs the first surface 12 on which the first electrode 13 is formed to the die pad 22 side.

The first electrode 13 is bonded to the die pad 22 via a conductive bonding material (for example, solder) 25 shown in FIG. 1. Therefore, the first electrode 13 of the semiconductor chip 10 is electrically connected to the first lead frame 21.

The connector 50 is mounted on the second surface 14 of the semiconductor chip 10. The connector 50 has a first portion 51 and a second portion 52. The first portion 51 and the second portion 52 have different thicknesses, and the first portion 51 is thicker than the second portion 52.

The connector 50 is molded by molding processing of a metal plate, and the first portion 51 and the second portion 52 are provided integrally. The connector 50 is made of copper excellent in electrical conductivity and thermal conductivity, for example. Also a copper alloy containing copper as a main component may be used as the connector 50.

The thickness of the first portion 51 is larger than the thickness of the lead frames 21, 31, and 41, and is not less than 0.5 mm and not more than 1 mm, for example. The first portion 51 has a first bonding surface 54 bonded to the second electrode 15 of the semiconductor ship 10 via a conductive bonding material 55 such as solder. The first portion 51 has a heat dissipation surface 53 formed on the opposite side to the first bonding surface 54 and exposed from the resin 80.

The second portion 52 protrudes from the first portion 51 to the second lead frame 31 side. The lower surface (second bonding surface) 52a in an end portion of the second portion 52 overlaps on the inner lead 32 of the second lead frame 31, and is bonded to the upper surface 32a of the inner lead 32 via a conductive bonding material 35 such as solder.

Thus, the connector 50 electrically connects the second electrode 15 of the semiconductor chip 10 and the second lead frame 31.

The second bonding surface 52a is a flat surface. A trench 61 is provided on the lower surface of the second portion 52 as a recess recessed toward the upper surface side of the second portion 52. The trench 61 extends continuously in a direction orthogonal to the protruding direction of the second portion 52.

The trench 61 is provided near the second bonding surface 52a further to the first portion 51 side than the second bonding surface 52a. A level difference is formed between the second bonding surface 52a and the trench 61. The trench 61 does not overlap on the upper surface 32a of the inner lead 32 of the second lead frame 31, and is formed further to the first lead frame 21 side than the inner lead 32.

As shown in FIG. 2B, the third electrode (gate electrode) 16 of the semiconductor chip 10 and the third lead frame 41 are electrically connected by a gate connector 70. Alternatively, the third electrode 16 and the third lead frame 41 may be connected together by wire bonding.

One end portion 71 of the gate connector 70 is bonded to the third electrode 16 via a conductive bonding material such as solder. Another end portion 72 of the gate connector 70 overlaps on the inner lead 42 of the third lead frame 41, and is bonded to the upper surface of the inner lead 42 of the third lead frame 41 via a conductive bonding material such as solder.

The semiconductor chip 10 is resin-sealed, and is protected from the external environment. The resin 80 covers the semiconductor chip 10, the upper surface of the die pad 22, the inner lead 32 of the second lead frame 31, the inner lead 42 of the third lead frame 41, the side surface of the first portion 51 of the connector 50, and the second portion 52 of the connector 50.

The resin 80 covers also the bonding portion between the first electrode 13 and the die pad 22, the bonding portion between the second electrode 15 and the connector 50, the bonding portion between the second portion 52 of the connector 50 and the inner lead 32 of the second lead frame 31, and the bonding portion between the third electrode 16 and the inner lead 42 of the third lead frame 41.

The lower surface of the first lead frame 21 (the lower surface of the lead 23 and the lower surface of the die pad 22), the lower surface of the outer lead 33 of the second lead frame 31, and the lower surface of the outer lead 43 of the third lead frame 41 are not covered with the resin 80 but exposed from the resin 80.

The lower surface of the first lead frame 21, the lower surface of the outer lead 33 of the second lead frame 31, and the lower surface of the outer lead 43 of the third lead frame 41 are bonded to a conductive pattern of a not-shown mounting substrate (an interconnection substrate) via, for example, solder.

As shown in FIG. 1 and FIG. 2A, the upper surface of the first portion 51 of the connector 50 is exposed from the resin 80, and functions as the heat dissipation surface 53. A heat sink may be joined onto the heat dissipation surface 53 of the connector 50 as necessary.

The heat generated in the semiconductor chip 10 is dissipated to the mounting substrate via the die pad 22 with a larger area than the first electrode 13, and is also dissipated to the outside of the semiconductor device 1 (for example, to the air) via the heat dissipation surface 53 of the connector 50. That is, the semiconductor device 1 of the embodiment has a both-surfaces heat dissipation package structure, and can enhance heat dissipation performance particularly in the case of electric power use in which the amount of heat generation in the chip tends to be large.

The first portion 51 of the connector 50 functions not only as an electrical connector between the semiconductor chip 10 and the second lead frame 31 but also as a heat dissipator serving for heat dissipation to the opposite direction to the mounting surface. The first portion 51 of the connector 50 is mounted immediately above the semiconductor chip 10, and the ratio of the area of the bonding surface between the second electrode 15 and the first portion 51 to the area of the second electrode 15 of the semiconductor chip 10 is 80% or more. The ratio of the area of the heat dissipation surface 53 of the connector 50 to the area of the second electrode 15 of the semiconductor chip 10 is 100% or more.

That is, a large part of the surface of the second electrode 15 is used as a heat conduction surface to the connector 50, and the heat conducted to the connector 50 is dissipated from the heat dissipation surface 53 with an area of not less than the area of the second electrode 15 to the outside of the semiconductor device 1. Thus, the connector 50 can be utilized effectively as a heat dissipator, and heat dissipation efficiency is good.

Not the entire connector 50 is made thick but the second portion 52 thinner than the first portion 51 is provided; thereby, a region where the resin 80 lies over from the upper surface side of the connector 50 is provided. That is, in the second portion 52, the resin 80 covers the upper surface of the connector 50. It is a structure in which the second portion 52 cuts into the resin 80. Therefore, the peeling of the resin 80 (the separation of the connector 50) can be suppressed as compared to a structure in which the entire upper surface of the connector 50 is exposed from the resin 80.

The bonding material described above is not limited to solder, and also a conductive paste such as a silver paste may be used. In any case, the bonding material is solidified from a state of being melted or having fluidity by heating, and fixes the portion between two objects and electrically connects both.

Here, in a state where the bonding material 55 bonding the connector 50 and the semiconductor chip 10 and the bonding material 35 bonding the connector 50 and the second lead frame 31 are melted, the connector 50 is in a state of lying on the molten bonding material, and a positional shift of the connector 50 (a positional shift in the plane direction) is a concern.

For example, if the second portion 52 of the connector 50 is greatly deviated from on the inner lead 32 of the second lead frame 31 to be shifted up to the outer lead 33, the second portion 52 of the connector 50 may interfere with a mold in a subsequent process of molding the resin 80. The interference between the connector 50 and the mold may lead to deformation or breakage of the connector 50 or the mold.

In the both-surfaces heat dissipation package structure in which the upper surface (heat dissipation surface) 53 of the connector 50 is exposed from the resin 80, the shift of the connector 50 appears on the external appearance of the device as illustrated by the alternate long and two short dashes line in FIG. 2, and this may cause inferior quality.

Thus, in the embodiment, the width of the second bonding surface 52a (the width in the direction parallel to the protruding direction of the second portion 52) is limited by forming the trench 61 near the second bonding surface 52a of the connector 50.

By the trench 61, wetly spreading of the molten bonding material 35 over the lower surface of the second portion 52 of the connector 50 to the first portion 51 side is suppressed. Therefore, the positional shift in the lateral direction in FIG. 1 of the second portion 52 is suppressed. Even if the bonding material 35 flows into the trench 61, spreading of the bonding material 35 that will cause a positional shift of the second portion 52 can be prevented unless the trench 61 is filled with the molten bonding material 35 and the bonding material 35 overflows from the trench 61.

The suppression of the positional shift of the second portion 52 with respect to the second lead frame 31 can suppress the positional shift of the entire connector 50, and can also suppress the positional shift of the first portion 51 with respect to the semiconductor chip 10.

Figure 4:
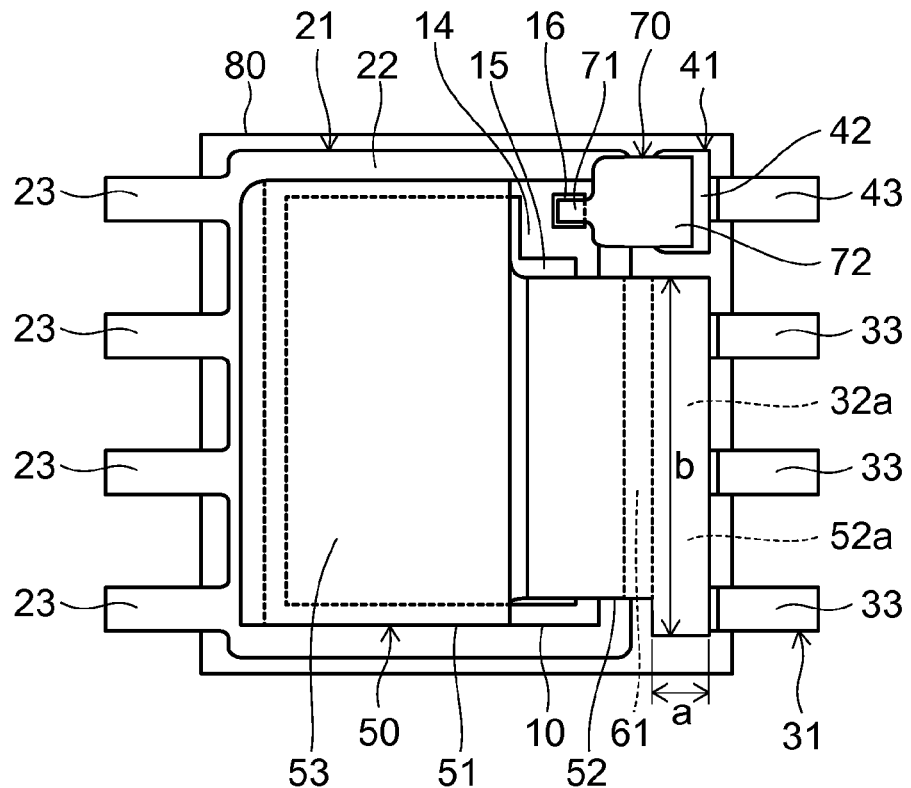
FIG. 4 is a schematic top view of the semiconductor device of the embodiment.

As shown in FIG. 4, the width "a" in the protruding direction of the second portion 52 may be made equal between the second bonding surface 52a of the second portion 52 of the connector 50 and the upper surface 32a of the inner lead 32 of the second lead frame 31. Thereby, the molten bonding material 35 does not spread across the width "a" in the width direction, and there is no room for the second portion 52 of the connector 50 to be shifted in the width direction.

By forming the trench 61 described above, the width of the second bonding surface 52a can be made equal to the width of the upper surface 32a of the second lead frame 31 easily.

The length "b" in a direction orthogonal to the protruding direction of the second portion 52 may be made equal between the second bonding surface 52a of the second portion 52 of the connector 50 and the upper surface 32a of the inner lead 32 of the second lead frame 31. Thereby, the molten bonding material 35 does not spread across the length "b" in the length direction, and there is no room for the second portion 52 of the connector 50 to be shifted in the length direction.

Figure 5:
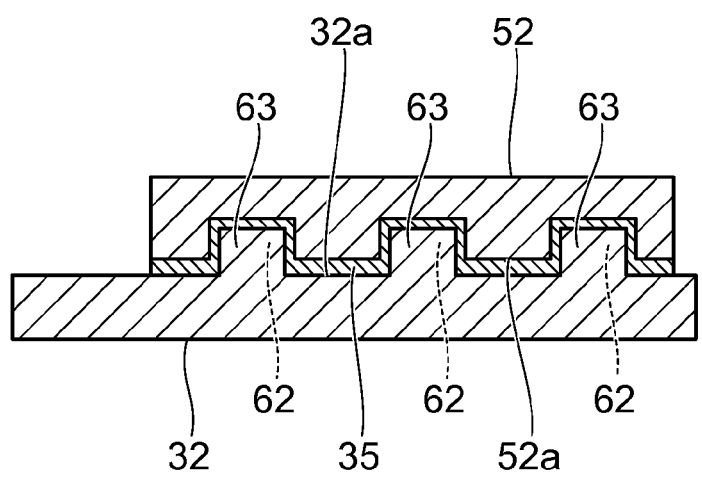
FIG. 5 is an enlarged cross section taken along A-A in FIG. 2B.

Also the structure of FIG. 5 may be used as a structure to suppress the shift in the length direction.

FIG. 5 shows an enlarged cross section taken along A-A in FIG. 2B.

In the example shown in FIG. 5, the second bonding surface 52a of the second portion 52 of the connector 50 is provided with recesses 62, and the upper surface 32a of the inner lead 32 of the second lead frame 31 is provided with protrusions 63, for example. By the engagement between the recess 62 and the protrusion 63, the positional shift of the second portion 52 of the connector 50 with respect to the inner lead 32 of the second lead frame 31 (the positional shift in a direction orthogonal to the protruding direction of the second portion 52) is regulated.

The second bonding surface 52a of the second portion 52 and the upper surface 32a of the inner lead 32 are bonded together via the bonding material 35, and the protrusion 63 is bonded to the inner wall of the recess 62 via the bonding material 35.

The recess 62 is formed as a trench extending in the direction in which the drawing sheet of FIG. 5 is penetrated, and in accordance with this also the protrusion 63 extends in the direction in which the drawing sheet is penetrated. Alternatively, the protrusion 63 may be a pin-like projection and the recess 62 may be a hole.

The second bonding surface 52a of the second portion 52 of the connector 50 may be provided with protrusions, and the upper surface 32a of the inner lead 32 of the second lead frame 31 may be provided with recesses.

Next, the structure to suppress the positional shift of the connector 50 with respect to the semiconductor chip 10 is described.

Figure 6A:
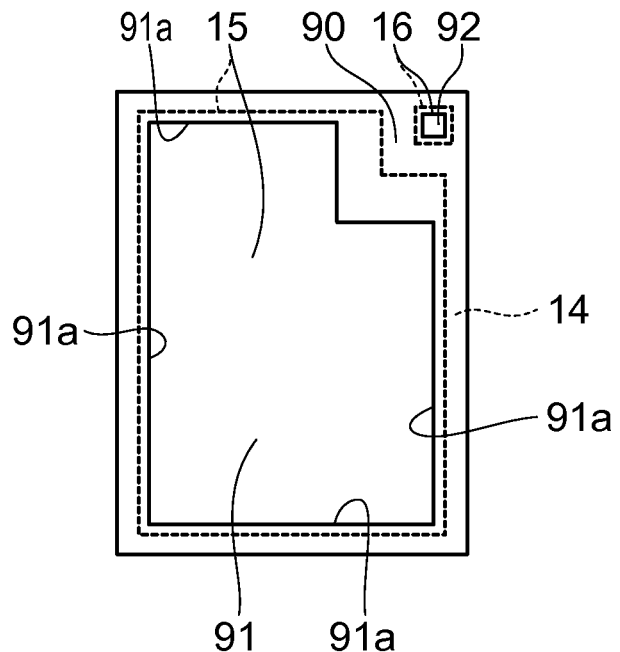
FIG. 6A is a schematic plan view of a semiconductor chip of the embodiment.

As shown in FIG. 3B, the second electrode 15 and the third electrode 16 are formed on the second surface 14 of the semiconductor chip 10. An insulating film 90 is formed on the second surface 14 as shown in FIG. 6A. The insulating film 90 is a resin film, for example, and is a polyimide film, for example.

A first opening 91 and a second opening 92 are formed in the insulating film 90. The second electrode 15 is exposed at the first opening 91. The third electrode 16 is exposed at the second opening 92. The edge of the second electrode 15 (shown by the broken line) is covered with the insulating film 90. The area of the first opening 91 is smaller than the area of the second electrode 15, and the edge 91a of the first opening 91 is located on the inside of the edge of the second electrode 15.

Similarly, the edge of the third electrode 16 (shown by the broken line) is covered with the insulating film 90. The area of the second opening 92 is smaller than the area of the third electrode 16, and the edge of the second opening 92 is located on the inside of the edge of the third electrode 16.

Figure 6B:
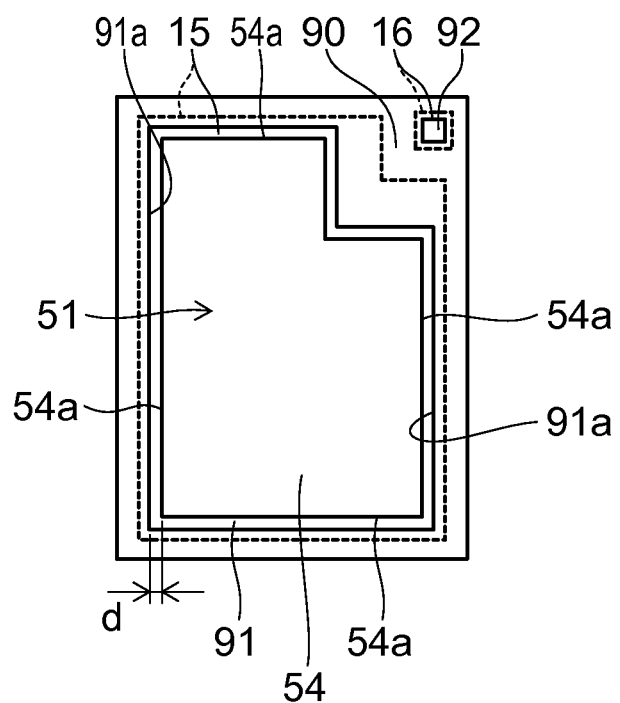
FIG. 6B is a schematic plan view in which a bonding surface of a connector is superposed on FIG. 6A.

FIG. 6B is a schematic plan view in which the bottom surface of the first portion 51 of the connector 50 (the first bonding surface 54) is superposed on FIG. 6A. That is, FIG. 6B schematically shows only a portion (surface) of the connector 50 bonded to the second electrode 15 of the semiconductor chip 10 via the bonding material 55 (shown in FIG. 1).

The area of the first bonding surface 54 of the connector 50 is smaller than the area of the second electrode 15 and the area of the first opening 91 of the insulating film 90, and the edge 54a of the first bonding surface 54 is located on the inside of the edge 91a of the first opening 91. The edge 54a of the first bonding surface 54 is located on the inside of the edge 91a of the first opening 91 of the insulating film 90 at a distance d of not less than 50 μm and not more than 200 μm.

Therefore, in a state where the first bonding surface 54 of the connector 50 lies on the second electrode 15 of the semiconductor chip 10 via the molten bonding material 55, any possible shift in the plane direction of the first bonding surface 54 with respect to the second electrode 15 can be limited within the distance d (not less than 50 μm and not more than 200 μm). The first bonding surface 54 of the connector 50 does not spread across the edge 91a of the first opening 91 of the insulating film 90 to the outside of the first opening 91. Thus, the positional shift of the connector 50 with respect to the semiconductor chip 10 can be suppressed.

The ratio of the area of the first opening 91 of the insulating film 90 to the area of the second electrode 15 is not less than 80% and less than 100%. That is, the second electrode 15 is bonded to the first portion 51 of the connector 50 in a region with an area ratio of 80% or more; therefore, the electric resistance of the bonding portion between the semiconductor chip 10 and the connector 50 can be reduced, and heat dissipation performance from the semiconductor chip 10 to the connector 50 can be improved.

By the embodiment described above, the positional shift of the connector 50 connecting the semiconductor chip 10 and the second lead frame 31 can be suppressed with respect to the semiconductor chip 10 and the second lead frame 31. Consequently, the increase in the resistance of the electrical connection between the semiconductor chip 10 and the second lead frame 31 via the connector 50 can be suppressed. Furthermore, heat dissipation performance via the connector 50 can be enhanced without causing a decrease in the thermal connection of the connector 50 to the semiconductor chip 10. The increase in the positional accuracy of the connector 50 stabilizes manufacturing and improves reliability.

Figure 7:
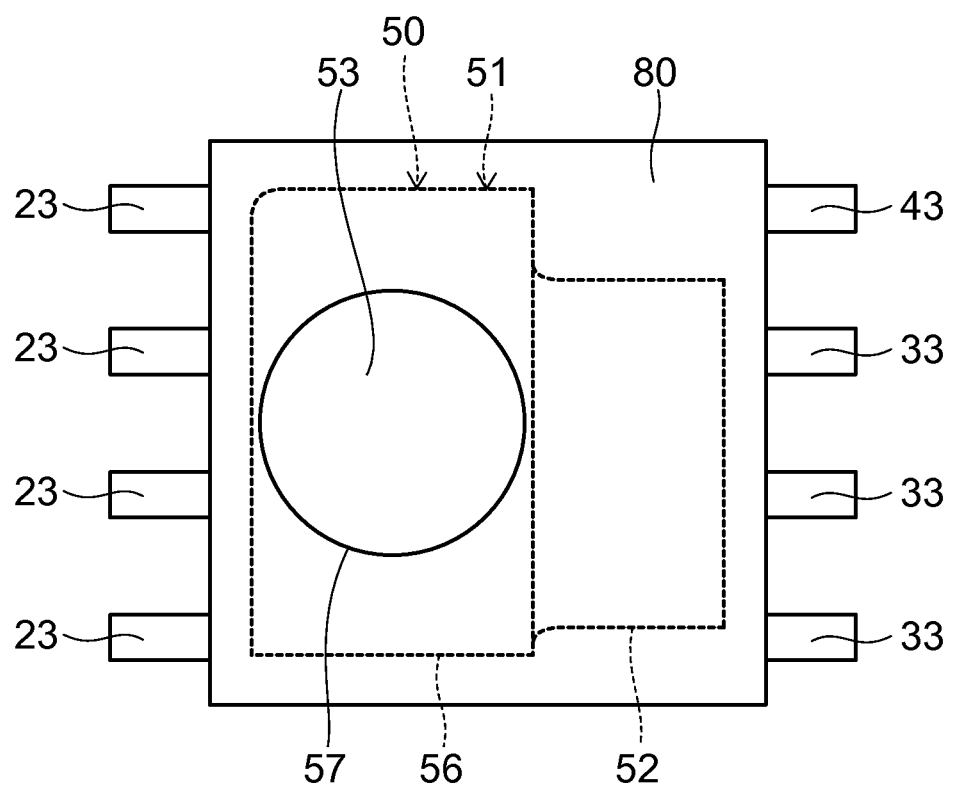
FIG. 7 is a schematic top view of a semiconductor device of the embodiment.

FIG. 7 is a schematic top view of a semiconductor device of another embodiment.

Figure 8:
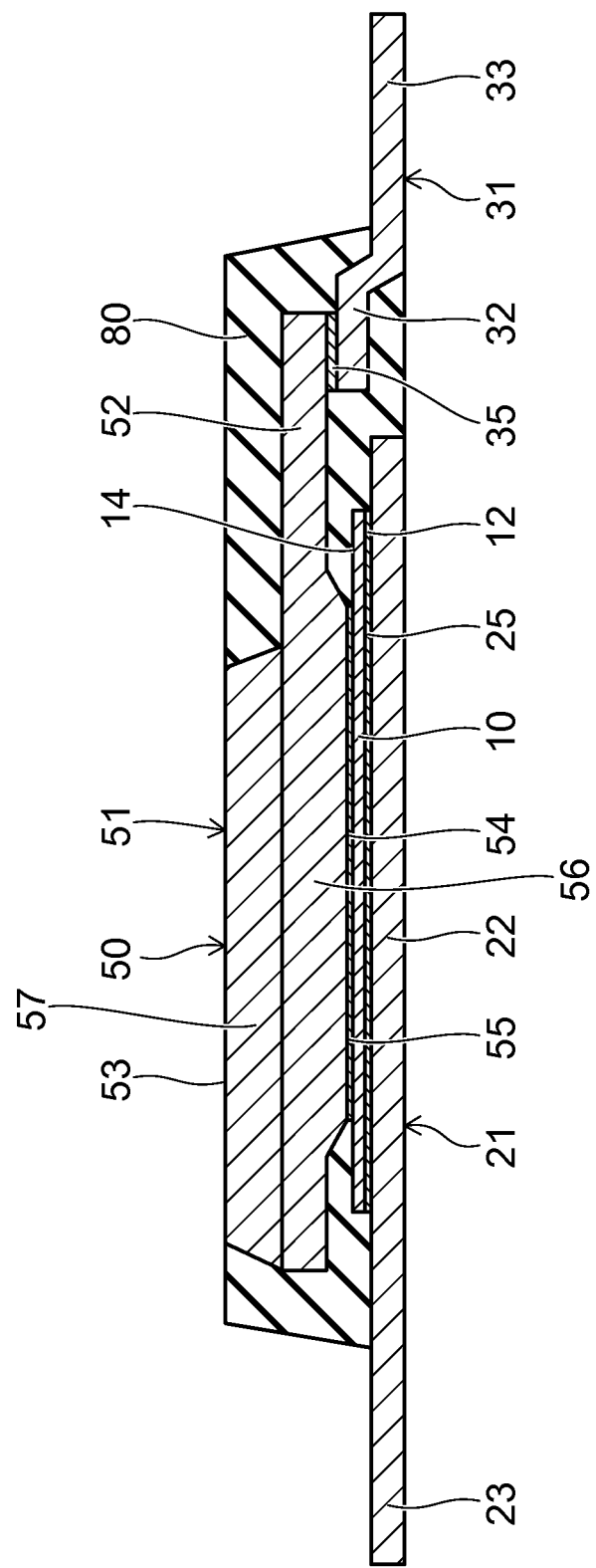
FIG. 8 is a schematic cross-sectional view of the semiconductor device of the embodiment.

FIG. 8 is a schematic cross-sectional view of the semiconductor device of the other embodiment.

In the case where the heat dissipation surface 53 of the connector 50 exposed from the resin 80 is in a quadrangular shape, if the connector 50 is positionally shifted so as to rotate in a plane parallel to the heat dissipation surface 53, the external outline of the heat dissipation surface 53 becomes non-parallel to the external outline of the package (the external outline of the resin 80) as shown by the alternate long and two short dashes line in FIG. 2A, and external appearance quality is likely to be impaired.

In contrast, when the heat dissipation surface 53 exposed from the resin 80 is shaped like a circle as shown in FIG. 7, any possible shift of the connector 50 in the rotation direction does not appear on the external appearance, and a reduction in external appearance quality is not caused.

In the first portion 51 of the connector 50, the bonding surface 54 bonded to the second electrode 15 of the semiconductor chip 10 may be shaped like a polygon (for example, substantially a quadrangle) with an area larger than the area of the circular heat dissipation surface 53. Thereby, a decrease in the bonding area between the second electrode 15 and the connector 50 can be prevented.

That is, as shown in FIGS. 7 and 8, the first portion 51 of the connector 50 has a structure in which an upper portion 57 in a truncated cone shape is provided on a lower portion 56 in a quadrangular plate shape. The lower surface of the lower portion 56 is the first bonding surface 54 in a substantially quadrangular shape, and the upper surface of the upper portion 57 is the heat dissipation surface 53 in a circular shape.

The embodiment shown in FIGS. 7 and 8 can be applied to all the embodiments shown in FIGS. 1 to 6B and FIG. 9.

Figure 9:
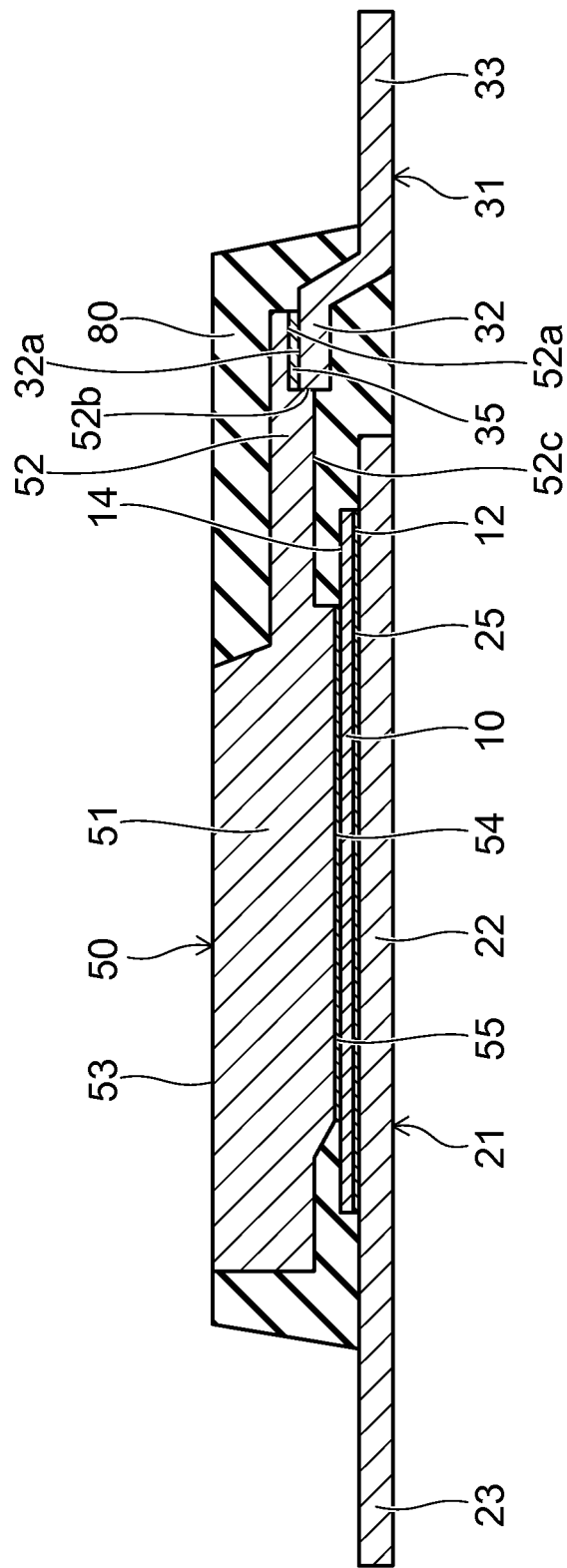
FIG. 9 is a schematic cross-sectional view of a semiconductor device of the embodiment.

FIG. 9 is a schematic cross-sectional view of a semiconductor device of another embodiment.

As shown in FIG. 9, a level difference portion 52b is provided between a lower surface 52c and the second bonding surface 52a of the second portion 52 of the connector 50.

The bonding material 35 is melted in a state where second bonding surface 52a of the connector 50 lies on the upper surface 32a of the inner lead 32 of the second lead frame 31 via the bonding material 35. At this time, the end of the inner lead 32 of the second lead frame 31 ends up at the side surface of the level difference portion 52b; thereby, the positional shift in the lateral direction in FIG. 9 of the connector 50 is regulated. The regulation of the positional shift of the connector 50 enhances the reliability of the electrical connection between the semiconductor chip 10 and the second lead frame 31 via the connector 50.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a first lead frame;
a second lead frame provided to be separated from the first lead frame;
a semiconductor chip provided on the first lead frame, the semiconductor chip having a first surface and a second surface opposite the first surface, the first surface bonded to the first lead frame;
a resin sealing the semiconductor chip; and
a connector having:
a first portion provided on the second surface of the semiconductor chip and bonded to a second electrode, the first portion having a first bonding surface bonded to the second electrode of the semiconductor chip, and a third surface opposite the first bonding surface and exposed from the resin; and
a second portion protruding from the first portion toward the second lead frame side and thinner than the first portion, the second portion having a second bonding surface bonded to the second lead frame, a lower surface provided between the first bonding surface and the second bonding surface, and a level difference portion provided between the second bonding surface and the lower surface, the second bonding surface provided on the second lead frame, the lower surface provided on the first lead frame, the second bonding surface being coplanar with a part of the lower surface.

2. The semiconductor device according to claim 1, wherein a recess is provided between the lower surface and the second bonding surface, and the level difference portion is provided between the recess and the second bonding surface.

3. The semiconductor device according to claim 2, wherein the recess is a trench extending in a direction orthogonal to a protruding direction of the second portion.

4. The semiconductor device according to claim 1, wherein the second bonding surface of the connector and an upper surface of the second lead frame bonded to the second bonding surface have the same width in a protruding direction of the second portion.

5. The semiconductor device according to claim 1, wherein the second bonding surface of the connector and an upper surface of the second lead frame bonded to the second bonding surface have the same length in a direction orthogonal to a protruding direction of the second portion.

6. The semiconductor device according to claim 1, wherein the third surface of the first portion of the connector is in a shape of a circle.

7. The semiconductor device according to claim 6, wherein the first bonding surface of the first portion is in a shape of a polygon with an area larger than an area of the third surface.

8. The semiconductor device according to claim 1, wherein the connector contains copper.

9. The semiconductor device according to claim 1, wherein a ratio of an area of the third surface to an area of the second electrode is 100% or more.

10. A semiconductor device comprising:
a first lead frame;
a second lead frame provided to be separated from the first lead frame;
a semiconductor chip provided on the first lead frame, the semiconductor chip including a semiconductor layer, a first electrode, and a second electrode, the semiconductor layer having a first surface and a second surface opposite the first surface, the first electrode being provided on the first surface and bonded to the first lead frame, the second electrode being provided on the second surface;
a resin sealing the semiconductor chip; and
a connector having:
a first portion provided on the second surface of the semiconductor chip and bonded to the second electrode, the first portion having a first bonding surface bonded to the second electrode of the semiconductor chip, and a third surface opposite the first bonding surface and exposed from the resin; and
a second portion protruding from the first portion toward the second lead frame side and thinner than the first portion, the second portion having a second bonding surface bonded to the second lead frame,
a first recess or a first protrusion provided at the second bonding surface of the connector,
a second protrusion engaging with the first recess or a second recess engaging with the first protrusion provided at an upper surface of the second lead frame bonded to the second bonding surface.

11. The semiconductor device according to claim 10, wherein the third surface of the first portion of the connector is in a shape of a circle.

12. The semiconductor device according to claim 11, wherein the first bonding surface of the first portion is in a shape of a polygon with an area larger than an area of the third surface.

13. The semiconductor device according to claim 10, wherein the connector contains copper.

14. The semiconductor device according to claim 10, wherein a ratio of an area of the third surface to an area of the second electrode is 100% or more.

15. A semiconductor device comprising:
a first lead frame;
a second lead frame provided to be separated from the first lead frame;
a semiconductor chip provided on the first lead frame, the semiconductor chip including a semiconductor layer, a first electrode, and a second electrode, the semiconductor layer having a first surface and a second surface opposite the first surface, the first electrode being provided on the first surface and bonded to the first lead frame, the second electrode being provided on the second surface;
an insulating film provided on the second surface and having an opening exposing the second electrode;
a resin sealing the semiconductor chip; and
a connector having:
a first portion provided on the second surface of the semiconductor chip and bonded to the second electrode, the first portion having a first bonding surface bonded to the second electrode of the semiconductor chip, and a third surface opposite the first bonding surface and exposed from the resin; and
a second portion protruding from the first portion to the second lead frame side and thinner than the first portion, the second portion having a second bonding surface bonded to the second lead frame,
an edge of the first bonding surface of the first portion of the connector being located on an inside of an edge of the opening of the insulating film at a distance of not less than 50 µm and not more than 200 µm.

16. The semiconductor device according to claim 15, wherein a ratio of an area of the opening to an area of the second electrode is not less than 80% and less than 100%.

17. The semiconductor device according to claim 15, wherein the third surface of the first portion of the connector is in a shape of a circle.

18. The semiconductor device according to claim 17, wherein the first bonding surface of the first portion is in a shape of a polygon with an area larger than an area of the third surface.

19. The semiconductor device according to claim 15, wherein the connector contains copper.

20. The semiconductor device according to claim 15, wherein a ratio of an area of the third surface to an area of the second electrode is 100% or more.

* * * * *